US011244630B2

(12) United States Patent
Feng et al.

(10) Patent No.: US 11,244,630 B2
(45) Date of Patent: Feb. 8, 2022

(54) SHIFT REGISTER UNIT, GATE DRIVING CIRCUIT, DISPLAY DEVICE, AND METHOD FOR CONTROLLING SHIFT REGISTER UNIT

(71) Applicants: HEFEI BOE JOINT TECHNOLOGY CO., LTD., Anhui (CN); BOE TECHNOLOGY GROUP CO., LTD., Beijing (CN)

(72) Inventors: Xuehuan Feng, Beijing (CN); Yongqian Li, Beijing (CN)

(73) Assignees: Hefei BOE Joint Technology Co., Ltd., Hefei (CN); BOE Technology Group Co., Ltd., Beijing (CN)

(*) Notice: Subject to any disclaimer, the term of this patent is extended or adjusted under 35 U.S.C. 154(b) by 0 days.

(21) Appl. No.: 17/265,226

(22) PCT Filed: Jun. 18, 2020

(86) PCT No.: PCT/CN2020/096756
§ 371 (c)(1),
(2) Date: Feb. 2, 2021

(87) PCT Pub. No.: WO2020/259379
PCT Pub. Date: Dec. 30, 2020

(65) Prior Publication Data
US 2021/0358417 A1 Nov. 18, 2021

(30) Foreign Application Priority Data

Jun. 25, 2019 (CN) .......................... 201910554290.7

(51) Int. Cl.
*G09G 3/3266* (2016.01)
*G09G 3/3258* (2016.01)
*G11C 19/28* (2006.01)

(52) U.S. Cl.
CPC ......... *G09G 3/3266* (2013.01); *G09G 3/3258* (2013.01); *G11C 19/28* (2013.01);
(Continued)

(58) Field of Classification Search
CPC ............... G09G 3/3266; G09G 3/3258; G09G 2300/0426; G09G 2310/0286; G09G 2310/08; G09G 2310/061; G11C 19/28
See application file for complete search history.

(56) References Cited

U.S. PATENT DOCUMENTS 10,236,073 B2   3/2019   Feng et al.
10,706,767 B2   7/2020   Fan et al.
(Continued)

FOREIGN PATENT DOCUMENTS

CN   101650909 A   2/2010
CN   105895046 A   8/2016
(Continued)

OTHER PUBLICATIONS

First office action issued in Chinese Patent Application No. 201910554290.7 with search report.

*Primary Examiner* — Christopher J Kohlman
(74) *Attorney, Agent, or Firm* — Chiwin Law LLC

(57) ABSTRACT

A shift register unit, a gate driving circuit, a display device, and a method for controlling a shift register unit are provided. The shift register unit includes a first input sub-circuit, a second input sub-circuit, a first isolation sub-circuit, and a first output sub-circuit. The first input sub-circuit is configured to control a potential of a first node. The second input sub-circuit is configured to control a potential of a second node. The first isolation sub-circuit is configured to control conduction and interruption of electrical coupling between the first node and the second node. The first output sub-circuit is configured to output a grate driving signal in (Continued)

a display phase and output a compensation driving signal in a field blanking phase.

20 Claims, 8 Drawing Sheets

(52) U.S. Cl.
CPC .............. *G09G 2300/0426* (2013.01); *G09G 2310/0286* (2013.01); *G09G 2310/061* (2013.01); *G09G 2310/08* (2013.01)

(56) References Cited

U.S. PATENT DOCUMENTS

| | | | |
|---|---|---|---|
| 11,017,711 | B2 | 5/2021 | Yuan et al. |
| 2012/0068994 | A1 | 3/2012 | Li et al. |
| 2017/0186360 | A1* | 6/2017 | Ma ..................... H01L 27/3244 |
| 2019/0035349 | A1* | 1/2019 | Jeong ..................... G02F 1/1368 |
| 2020/0066209 | A1* | 2/2020 | Zhang ..................... G09G 3/3677 |
| 2020/0211435 | A1 | 7/2020 | Wang et al. |
| 2021/0166597 | A1 | 6/2021 | Feng et al. |

FOREIGN PATENT DOCUMENTS

| | | | |
|---|---|---|---|
| CN | 106601176 | A | 4/2017 |
| CN | 107068088 | A | 8/2017 |
| CN | 109616041 | A | 4/2019 |
| CN | 109658888 | A | 4/2019 |
| CN | 109920357 | A | 6/2019 |
| CN | 109920387 | A | 6/2019 |
| CN | 109935208 | A | 6/2019 |
| KR | 100685842 | B1 | 2/2007 |

* cited by examiner

SHIFT REGISTER UNIT, GATE DRIVING CIRCUIT, DISPLAY DEVICE, AND METHOD FOR CONTROLLING SHIFT REGISTER UNIT

This application is a U.S. National Phase Entry of International Application No. PCT/CN2020/096756 filed on Jun. 18, 2020, designating the United States of America and claiming priority to Chinese Patent Application No. 201910554290.7, filed on Jun. 25, 2019. The present application claims priority to and the benefit of the above-identified applications and the above-identified applications are incorporated by reference herein in their entirety.

TECHNICAL FIELD

Embodiments of the present disclosure relate to a shift register unit, a gate driving circuit, a display device, and a method for controlling a shift register unit.

BACKGROUND

The organic light emitting diode (OLED) display device has gradually attracted widespread attention due to the advantages of wide viewing angle, high contrast ratio, fast response speed, and higher light emitting luminance and lower driving voltage compared with the inorganic light emitting display device. Due to the above characteristics, the organic light emitting diodes (OLEDs) may be applicable to devices having a display function such as mobile phones, displays, notebook computers, digital cameras, instruments and meters, etc.

SUMMARY

At least one embodiment of the present disclosure provides a shift register unit, which includes: a first input sub-circuit that is configured to control a potential of a first node, a second input sub-circuit that is configured to control a potential of a second node, a first isolation sub-circuit that is between the first node and the second node and configured to control conduction and interruption of electrical coupling between the first node and the second node, and a first output sub-circuit that is electrically connected to the first node, and is configured to output a gate driving signal in a display phase and output a compensation driving signal in a field blanking phase after the display phase.

For example, in the shift register unit provided by at least one embodiment of the present disclosure, the first input sub-circuit is configured to change the potential of the first node from a first level to a second level under the control of a first input signal in the display phase. The second input sub-circuit is between a first voltage terminal and a second voltage terminal, the first voltage terminal is used for providing the first level, the second voltage terminal is used for providing the second level, and the second input sub-circuit is configured to change the potential of the second node from the first level to the second level under the control of a second input signal in the display phase and maintain the potential of the second node at the second level until the field blanking phase. The first isolation sub-circuit is configured to conduct the electrical coupling between the first node and the second node under the control of a third input signal in the field blanking phase, so that the potential of the first node after being reset changes from the first level to the second level. The first output sub-circuit is configured to, in the display phase, change the potential of the first node from the second level to a third level under the control of a first clock signal so as to output the gate driving signal, and configured to, in the field blanking phase, change the potential of the first node from the second level to the third level under the control of the first clock signal so as to output the compensation driving signal, and the second level is between the first level and the third level.

For example, in the shift register unit provided by at least one embodiment of the present disclosure, the second input sub-circuit includes a first capacitor and a first switching transistor. A first terminal of the first capacitor is electrically connected to the second node, and a second terminal of the first capacitor is electrically connected to the first voltage terminal. A first electrode of the first switching transistor is electrically connected to the second voltage terminal, a second electrode of the first switching transistor is electrically connected to the second node, and a gate electrode of the first switching transistor is configured to receive the second input signal.

For example, in the shift register unit provided by at least one embodiment of the present disclosure, the first isolation sub-circuit comprises a second switching transistor. A first electrode of the second switching transistor is electrically connected to the first node, a second electrode of the second switching transistor is electrically connected to the second node, and a gate electrode of the second switching transistor is configured to receive the third input signal.

For example, in the shift register unit provided by at least one embodiment of the present disclosure, the shift register unit further includes a first reset sub-circuit that is configured to reset the potential of the first node under the control of a first reset signal, a second reset sub-circuit that is configured to reset the potential of the first node and the potential of the second node under the control of a second reset signal, and a third reset sub-circuit that is configured to reset the potential of the second node under the control of a fourth input signal and a fifth input signal.

For example, in the shift register unit provided by at least one embodiment of the present disclosure, the first reset sub-circuit comprises a third switching transistor. A first electrode of the third switching transistor is electrically connected to the first node, a second electrode of the third switching transistor is electrically connected to the first voltage terminal, and a gate electrode of the third switching transistor is configured to receive the first reset signal.

For example, in the shift register unit provided by at least one embodiment of the present disclosure, the second reset sub-circuit includes a fourth switching transistor. A first electrode of the fourth switching transistor is electrically connected to the second node, a second electrode of the fourth switching transistor is electrically connected to the first voltage terminal, and a gate electrode of the fourth switching transistor is configured to receive the second reset signal.

For example, in the shift register unit provided by at least one embodiment of the present disclosure, the third reset sub-circuit comprises a fifth switching transistor and a sixth switching transistor. A first electrode of the fifth switching transistor is electrically connected to the second node, a second electrode of the fifth switching transistor is electrically connected to a first electrode of the sixth switching transistor, and a gate electrode of the fifth switching transistor is configured to receive the fourth input signal. A second electrode of the sixth switching transistor is electrically connected to the first voltage terminal, and a gate electrode of the sixth switching transistor is configured to receive the fifth input signal.

For example, the shift register unit provided by at least one embodiment of the present disclosure further includes: a second output sub-circuit that is electrically connected to the first node and is configured to output a carry control signal under the control of a second clock signal in the display phase.

For example, the shift register unit provided by at least one embodiment of the present disclosure further includes: a noise reduction sub-circuit that is configured to maintain the potential of the first node at the first level in the case where the potential of the first node is reset, and a potential maintaining sub-circuit that is configured to maintain a potential of an output terminal of the first output sub-circuit at a fourth level and maintain a potential of an output terminal of the second output sub-circuit at the first level in the case where the potential of the first node is reset. The second level is between the fourth level and the third level.

For example, in the shift register unit provided by at least one embodiment of the present disclosure, the noise reduction sub-circuit comprises a seventh switching transistor, an eighth switching transistor, and a ninth switching transistor. A first electrode of the seventh switching transistor and a gate electrode of the seventh switching transistor are both electrically connected to a third voltage terminal for providing the second level, and a second electrode of the seventh switching transistor is electrically connected to a third node. A first electrode of the eighth switching transistor is electrically connected to the third node, a second electrode of the eighth switching transistor is electrically connected to the first voltage terminal, and a gate electrode of the eighth switching transistor is electrically connected to the first node. A first electrode of the ninth switching transistor is electrically connected to the first node, a second electrode of the ninth switching transistor is electrically connected to the first voltage terminal, and a gate electrode of the ninth switching transistor is electrically connected to the third node.

For example, in the shift register unit provided by at least one embodiment of the present disclosure, the potential maintaining sub-circuit includes a tenth switching transistor and an eleventh switching transistor. A first electrode of the tenth switching transistor is electrically connected to the output terminal of the second output sub-circuit, a second electrode of the tenth switching transistor is electrically connected to the first voltage terminal, and a gate electrode of the tenth switching transistor is electrically connected to the third node. A first electrode of the eleventh switching transistor is electrically connected to the output terminal of the first output sub-circuit, a second electrode of the eleventh switching transistor is electrically connected to a fourth voltage terminal for providing the fourth level, and a gate electrode of the eleventh switching transistor is electrically connected to the third node.

For example, in the shift register unit provided by at least one embodiment of the present disclosure, the first output sub-circuit includes a twelfth switching transistor and a second capacitor. A first electrode of the twelfth switching transistor is configured to receive the first clock signal, a second electrode of the twelfth switching transistor serves as an output terminal of the first output sub-circuit, and a gate electrode of the twelfth switching transistor is electrically connected to the first node. A first terminal of the second capacitor is electrically connected to the gate electrode of the twelfth switching transistor, and a second terminal of the second capacitor is electrically connected to the second electrode of the twelfth switching transistor.

For example, in the shift register unit provided by at least one embodiment of the present disclosure, the second output sub-circuit includes a thirteenth switching transistor. A first electrode of the thirteenth switching transistor is configured to receive the second clock signal, a second electrode of the thirteenth switching transistor serves as an output terminal of the second output sub-circuit, and a gate electrode of the thirteenth switching transistor is electrically connected to the first node.

For example, in the shift register unit provided by at least one embodiment of the present disclosure, the first input sub-circuit includes a fourteenth switching transistor. A first electrode of the fourteenth switching transistor is electrically connected to a fifth voltage terminal for providing the second level, a second electrode of the fourteenth switching transistor is electrically connected to the first node, and a gate electrode of the fourteenth switching transistor is configured to receive the first input signal.

For example, the shift register unit provided by at least one embodiment of the present disclosure further includes: a first reset sub-circuit, a second reset sub-circuit, a third reset sub-circuit, a second output sub-circuit, a noise reduction sub-circuit, and a potential maintaining sub-circuit. The second input sub-circuit includes a first capacitor and a first switching transistor. A first terminal of the first capacitor is electrically connected to the second node, a second terminal of the first capacitor is electrically connected to the first voltage terminal, a first electrode of the first switching transistor is electrically connected to the second voltage terminal, a second electrode of the first switching transistor is electrically connected to the second node, and a gate electrode of the first switching transistor is configured to receive the second input signal. The first isolation sub-circuit includes a second switching transistor. A first electrode of the second switching transistor is electrically connected to the first node, a second electrode of the second switching transistor is electrically connected to the second node, and a gate electrode of the second switching transistor is configured to receive the third input signal. The first reset sub-circuit includes a third switching transistor. A first electrode of the third switching transistor is electrically connected to the first node, a second electrode of the third switching transistor is electrically connected to the first voltage terminal, and a gate electrode of the third switching transistor is configured to receive a first reset signal. The second reset sub-circuit includes a fourth switching transistor. A first electrode of the fourth switching transistor is electrically connected to the second node, a second electrode of the fourth switching transistor is electrically connected to the first voltage terminal, and a gate electrode of the fourth switching transistor is configured to receive a second reset signal. The third reset sub-circuit includes a fifth switching transistor and a sixth switching transistor. A first electrode of the fifth switching transistor is electrically connected to the second node, a second electrode of the fifth switching transistor is electrically connected to a first electrode of the sixth switching transistor, a gate electrode of the fifth switching transistor is configured to receive a fourth input signal, a second electrode of the sixth switching transistor is electrically connected to the first voltage terminal, and a gate electrode of the sixth switching transistor is configured to receive a fifth input signal. The noise reduction sub-circuit includes a seventh switching transistor, an eighth switching transistor, and a ninth switching transistor. A first electrode of the seventh switching transistor and a gate electrode of the seventh switching transistor are both electrically connected to a third voltage terminal for providing the second level, a second electrode of the seventh switching transistor is electrically connected to a third node, a first electrode of the eighth switching transistor is electrically connected to the third node, a second electrode of the eighth switching transistor is electrically connected to the first voltage terminal, a gate electrode of the eighth switching transistor is electrically connected to the first node, a first electrode of the ninth switching transistor is electrically connected to the first node, a second electrode of the ninth switching transistor is electrically connected to the first voltage terminal, and a gate electrode of the ninth switching transistor is electrically connected to the third node. The potential maintaining sub-circuit includes a tenth switching transistor and an eleventh switching transistor. A first electrode of the tenth switching transistor is electrically connected to the output terminal of the second output sub-circuit, a second electrode of the tenth switching transistor is electrically connected to the first voltage terminal, and a gate electrode of the tenth switching transistor is electrically connected to the third node, a first electrode of the eleventh switching transistor is electrically connected to an output terminal of the first output sub-circuit, a second electrode of the eleventh switching transistor is electrically connected to a fourth voltage terminal for providing a fourth level, and a gate electrode of the eleventh switching transistor is electrically connected to the third node. The first output sub-circuit includes a twelfth switching transistor and a second capacitor. A first electrode of the twelfth switching transistor is configured to receive the first clock signal, a second electrode of the twelfth switching transistor serves as the output terminal of the first output sub-circuit, a gate electrode of the twelfth switching transistor is electrically connected to the first node, a first terminal of the second capacitor is electrically connected to the gate electrode of the twelfth switching transistor, and a second terminal of the second capacitor is electrically connected to the second electrode of the twelfth switching transistor. The second output sub-circuit includes a thirteenth switching transistor. A first electrode of the thirteenth switching transistor is configured to receive a second clock signal, a second electrode of the thirteenth switching transistor serves as the output terminal of the second output sub-circuit, and a gate electrode of the thirteenth switching transistor is electrically connected to the first node. The first input sub-circuit includes a fourteenth switching transistor. A first electrode of the fourteenth switching transistor is electrically connected to a fifth voltage terminal for providing the second level, a second electrode of the fourteenth switching transistor is electrically connected to the first node, and a gate electrode of the fourteenth switching transistor is configured to receive the first input signal. 7

At least one embodiment of the present disclosure further provides a gate driving circuit, which includes a plurality of shift register units described above.

For example, in the gate driving circuit provided by at least one embodiment of the present disclosure, the plurality of shift register units comprise N shift register units, and N is a positive integer. Among the N shift register units, a carry control signal output by an $(i-x1)^{th}$ shift register unit serves as a first input signal and a second input signal of an $i^{th}$ shift register unit, first input signals for first to $x1^{th}$ shift register units are respectively first input signals output by an external circuit, and second input signals for the first to $x1^{th}$ shift register units are respectively second input signals output by the external circuit, $x1+1 \le i \le N$, i is a positive integer, and x1 is a positive integer. And among the N shift register units, a carry control signal output by a $(j+x2)^{th}$ shift register unit serves as a first reset signal and a fourth input signal of a $j^{th}$ shift register unit, first reset signals for $(N-x2+1)^{th}$ to $N^{th}$ shift register units are respectively first reset signals output by the external circuit, fourth input signals for the $(N-x2+1)^{th}$ to $N^{th}$ shift register units are respectively fourth input signals output by the external circuit, $1 \le j \le N-x2$, j is a positive integer, and x2 is a positive integer.

At least one embodiment of the present disclosure further provides a display device, which includes the gate driving circuit described above.

At least one embodiment of the present disclosure further provides a method for controlling a shift register unit, and the method includes: in a first phase, changing, by a first input sub-circuit, a potential of a first node from a first level to a second level under the control of a first input signal, and changing, by a second input sub-circuit, a potential of a second node from the first level to the second level under the control of a second input signal, and maintaining the second level of the second node until a field blanking phase; in a second phase, changing, by a first output sub-circuit, the potential of the first node from the second level to a third level under the control of a first clock signal so as to output a gate driving signal, and the second level being between the first level and the third level; in a third phase, resetting, by a first reset sub-circuit, the potential of the first node under the control of a first reset signal; in a fourth phase, conducting, by a first isolation sub-circuit, electrical coupling between the first node and the second node under the control of a third input signal, so that the potential of the first node after being reset changes from the first level to the second level; and in a fifth phase, changing, by the first output sub-circuit, the potential of the first node from the second level to the third level under control of the first clock signal so as to output a compensation driving signal. The first phase, the second phase, and the third phase are all within a display phase, and the fourth phase and the fifth phase are all within the field blanking phase.

BRIEF DESCRIPTION OF THE DRAWINGS

The drawings, which form a part of the specification, describe embodiments of the disclosure, and serve to explain the principles of the present disclosure together with the specification. In order to more clearly illustrate the technical schemes of the embodiments of the present disclosure, the drawings of the embodiments will be briefly described in the following. It is obvious that the described drawings below are only related to some embodiments of the disclosure and are not limitative to the disclosure.

It should be understood that the dimensions of various components illustrated in the drawings are not drawn according to the actual scale relationship. In addition, the same or similar reference numerals indicate the same or similar elements.

DETAILED DESCRIPTION

Figure 1:
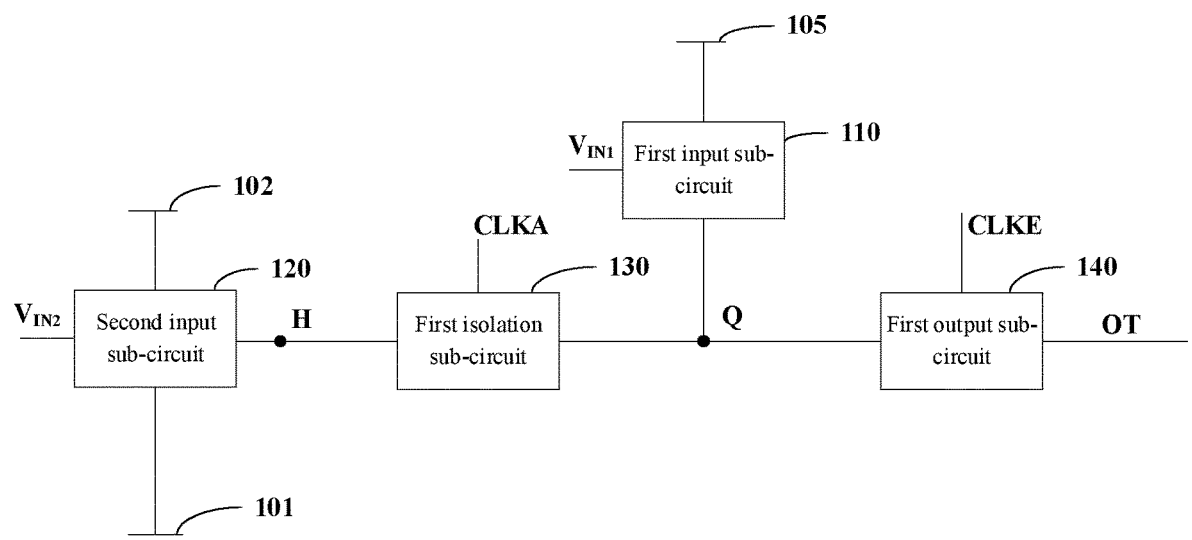
FIG. 1 is a structural diagram illustrating a shift register unit according to at least one embodiment of the present disclosure.

Various exemplary embodiments of the present disclosure are described in detail with reference to the drawings. The description of the exemplary embodiments is merely illustrative, and not for the purpose of limiting the disclosure and its application or usage. The present disclosure may be implemented in many different forms and is not limited to the embodiments described herein. These embodiments are provided to make the present disclosure thorough and complete, and to fully express the scope of the present disclosure to those skilled in the art. It should be noted that, unless specifically stated otherwise, the relative arrangement of components and steps, the composition of materials, numerical expressions and numerical values set forth in these embodiments should be interpreted as merely exemplary instead of restrictive.

As used in the present disclosure, "first," "second," and similar words do not indicate any sequence, amount or importance, but used to distinguish various components. Similar words such as "comprise/comprising," "include/including," or the like are intended to specify that the elements stated before these words encompass the elements listed after these words, but not preclude other elements. The terms, "on," "under," "left," "right," or the like are only used to indicate a relative position relationship, and when the absolute position of the object which is described is changed, the relative position relationship may be changed accordingly.

In the present disclosure, when it is described that a particular device is between a first device and a second device, there may or may not be an intervening device between the particular device and the first device or the second device. When it is described that a particular device is connected to another device, the particular device may be directly connected to the other device without intervening devices, or may not be directly connected to the other device with intervening devices.

All terms used in the present disclosure (including technical terms or scientific terms) have the same meanings as those understood by those of ordinary skill in the art to which the present disclosure belongs, unless otherwise specifically defined. It should also be understood that terms defined in, for example, a general dictionary should be interpreted as having meanings consistent with their meanings in the context of the related art, and should not be interpreted in an idealized or extremely formal sense unless explicitly defined here.

The techniques, methods, and devices known to those of ordinary skill in relevant fields may not be discussed in detail, but the techniques, methods, and devices should be regarded as part of the specification under appropriate circumstances.

The inventors of the present disclosure found that in the related technologies, it is difficult for a gate driving circuit to output a driving signal for display (which may be referred to a gate driving signal) and a driving signal for sub-pixel compensation (which may be referred to a compensation driving signal). Here, the compensation driving signal refers to a gate signal required in a compensation process. For example, the two driving signals may be waveforms with different periods and different pulse widths, respectively.

Thus, the embodiments of the present disclosure provide a shift register unit for a gate driving circuit, in order to output a gate driving signal and a compensation driving signal at different time periods (for example, output a gate driving signal in a display phase and output a compensation driving signal in a field blanking phase).

At least one embodiment of the present disclosure provides a shift register unit, which includes a first input sub-circuit, a second input sub-circuit, a first isolation sub-circuit, and a first output sub-circuit. The first input sub-circuit is configured to control a potential of a first node. The second input sub-circuit is configured to control a potential of a second node. The first isolation sub-circuit is between the first node and the second node, and is configured to control conduction and interruption of electrical coupling between the first node and the second node. The first output sub-circuit is electrically connected to the first node, and configured to output a gate driving signal in a display phase and output a compensation driving signal in a field blanking phase after the display phase.

In the embodiments of the present disclosure, in the display phase, the shift register unit may output the gate driving signal by controlling the potential of the first node. In the field blanking phase, the shift register unit can conduct the electrical coupling between the first node and the second node, and change the potential of the first node from the first level to the second level by using the second level at which the second node is maintained, thereby outputting the compensation driving signal. Therefore, the shift register unit achieves the purpose of outputting the gate driving signal in the display phase and outputting the compensation driving signal in the field blanking phase. The embodiments of the present disclosure use a same shift register unit to output two kinds of signals, which simplifies the circuit arrangements, and the circuit structure of the shift register unit is simplified and the shift register unit is easy to be controlled.

Shift register units according to some embodiments of the present disclosure are described in detail below with reference to the drawings.

FIG. 1 is a structural diagram illustrating a shift register unit according to at least one embodiment of the present disclosure. As illustrated in FIG. 1, the shift register unit may include a first input sub-circuit 110, a second input sub-circuit 120, a first isolation sub-circuit 130, and a first output sub-circuit 140.

The first input sub-circuit 110 may be configured to control a potential of a first node Q. The first input sub-circuit 110 may be electrically connected to the first node Q and a fifth voltage terminal 105. The fifth voltage terminal 105 is used to provide a second level. For example, the first input sub-circuit 110 may be configured to change the potential of the first node Q from a first level to the second level under control of a first input signal VIN1 in a display phase.

The second input sub-circuit 120 may be configured to control a potential of a second node H. The second input sub-circuit 120 may be between a first voltage terminal 101 and a second voltage terminal 102. The first voltage terminal 101 is used to provide the first level. The second voltage terminal 102 is used to provide the second level. For example, the second input sub-circuit 120 may be configured to change the potential of the second node H from the first level to the second level under control of a second input signal $V_{IN2}$ in the display phase, and maintain the potential of the second node H at the second level until a field blanking phase.

The first isolation sub-circuit 130 is between the first node Q and the second node H. The first isolation sub-circuit 130 may be configured to control the conduction and interruption of electrical coupling between the first node Q and the second node H. For example, the first isolation sub-circuit 130 may be configured to conduct the electrical coupling between the first node Q and the second node H under control of a third input signal CLKA in the field blanking phase, so that the potential of the first node Q after being reset changes from the first level to the second level.

The first output sub-circuit 140 is electrically connected to the first node Q. The first output sub-circuit 140 may be configured to output a gate driving signal in the display phase and output a compensation driving signal in the field blanking phase after the display phase. "OT" in FIG. 1 indicates the signal output by the first output sub-circuit (which can be a gate driving signal or a compensation driving signal). For example, the first output sub-circuit 140 may be configured to, in the display phase, change the potential of the first node Q from the second level to a third level under control of a first clock signal CLKE so as to output the gate driving signal, and configured to, in the field blanking phase, change the potential of the first node Q from the second level to the third level under control of the first clock signal CLKE so as to output the compensation driving signal.

It should be noted that in the embodiments of the present disclosure, the second level is between the first level and the third level. In some embodiments, the first level is lower than the second level and the second level is lower than the third level. For example, the first level is a low level, the second level is a high level, and the third level is higher than the second level. In some other embodiments, the first level is higher than the second level, and the second level is higher than the third level. For example, the first level is a high level, the second level is a low level, and the third level is lower than the second level.

So far, the shift register unit according to some embodiments of the present disclosure is provided. In the display phase, the shift register unit may output the gate driving signal by controlling the potential of the first node Q. In the field blanking phase, the shift register unit may conduct the electrical coupling between the first node Q and the second node H, and change the potential of the first node Q from the first level to the second level by using the second level at which the second node H is maintained, thereby outputting the compensation driving signal. Therefore, the shift register unit achieves the purpose of outputting the gate driving signal in the display phase and outputting the compensation driving signal in the field blanking phase.

It should be noted that the gate driving signal can be used to be output via a corresponding gate line during the display process of a display device. The compensation driving signal is also output via a corresponding gate line as a gate signal required by the sub-pixel compensation process. The method or process of sub-pixel compensation can adopt the known technologies and would not be described in detail here.

Figure 2:
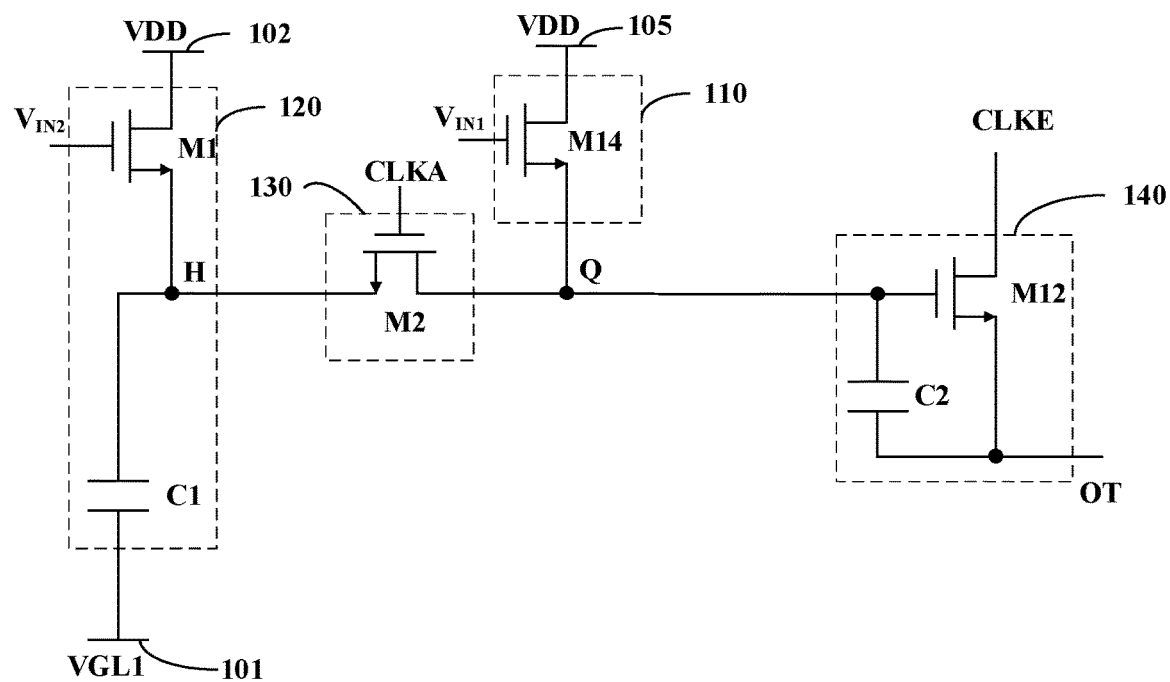
FIG. 2 is a circuit structure diagram illustrating a shift register unit according to at least one embodiment of the present disclosure.

FIG. 2 is a circuit structure diagram illustrating a shift register unit according to at least one embodiment of the present disclosure.

In some embodiments, as illustrated in FIG. 2, the second input sub-circuit 120 may include a first capacitor C1 and a first switching transistor M1. A first terminal of the first capacitor C1 is electrically connected to the second node H. A second terminal of the first capacitor C1 is electrically connected to the first voltage terminal 101. For example, the first voltage terminal may provide a low level VGL1 (as the first level). For example, the low level VGL1 may be a negative level. A first electrode of the first switching transistor M1 is electrically connected to the second voltage terminal 102. For example, the second voltage terminal 102 can provide a power supply voltage VDD (as the second level). A second electrode of the first switching transistor M1 is electrically connected to the second node H. A gate electrode of the first switching transistor M1 is configured to receive a second input signal $V_{IN2}$.

For example, the first switching transistor M1 may be an N-channel metal oxide semiconductor (NMOS) transistor or a P-channel metal oxide semiconductor (PMOS) transistor. For example, the first capacitor C1 may be an external capacitor or a parasitic capacitor.

In some embodiments, as illustrated in FIG. 2, the first isolation sub-circuit 130 may include a second switching transistor M2. A first electrode of the second switching transistor M2 is electrically connected to the first node Q. A second electrode of the second switching transistor M2 is electrically connected to the second node H. A gate electrode of the second switching transistor M2 is configured to receive a third input signal CLKA. For example, the second switching transistor M2 may be an NMOS transistor or a PMOS transistor.

In some embodiments, as illustrated in FIG. 2, the first output sub-circuit 140 may include a twelfth switching transistor M12 and a second capacitor C2. A first electrode of the twelfth switching transistor M12 is configured to receive the first clock signal CLKE. A second electrode of the twelfth switching transistor M12 serves as an output terminal of the first output sub-circuit 140. A gate electrode of the twelfth switching transistor M12 is electrically connected to the first node Q. A first terminal of the second capacitor C2 is electrically connected to the gate electrode of the twelfth switching transistor M12. A second terminal of the second capacitor C2 is electrically connected to the second electrode of the twelfth switching transistor M12. For example, the twelfth switching transistor M12 may be an NMOS transistor or a PMOS transistor. For example, the second capacitor C2 may be an external capacitor or a parasitic capacitor of the twelfth switching transistor M12.

In some embodiments, as illustrated in FIG. 2, the first input sub-circuit 110 may include a fourteenth switching transistor M14. A first electrode of the fourteenth switching transistor M14 is electrically connected to the fifth voltage terminal 105 for providing the second level (e.g., a power supply voltage VDD). A second electrode of the fourteenth switching transistor M14 is electrically connected to the first node Q. A gate electrode of the fourteenth switching transistor M14 is configured to receive the first input signal $V_{IN1}$. For example, the fourteenth switching transistor M14 may be an NMOS transistor or a PMOS transistor.

So far, the specific circuit structure of each sub-circuit of the shift register unit according to some embodiments of the present disclosure has been described. Each sub-circuit described above can implement corresponding functions respectively, so that the shift register unit can realize the purpose of outputting the gate driving signal and the compensating driving signal, respectively.

Figure 3:
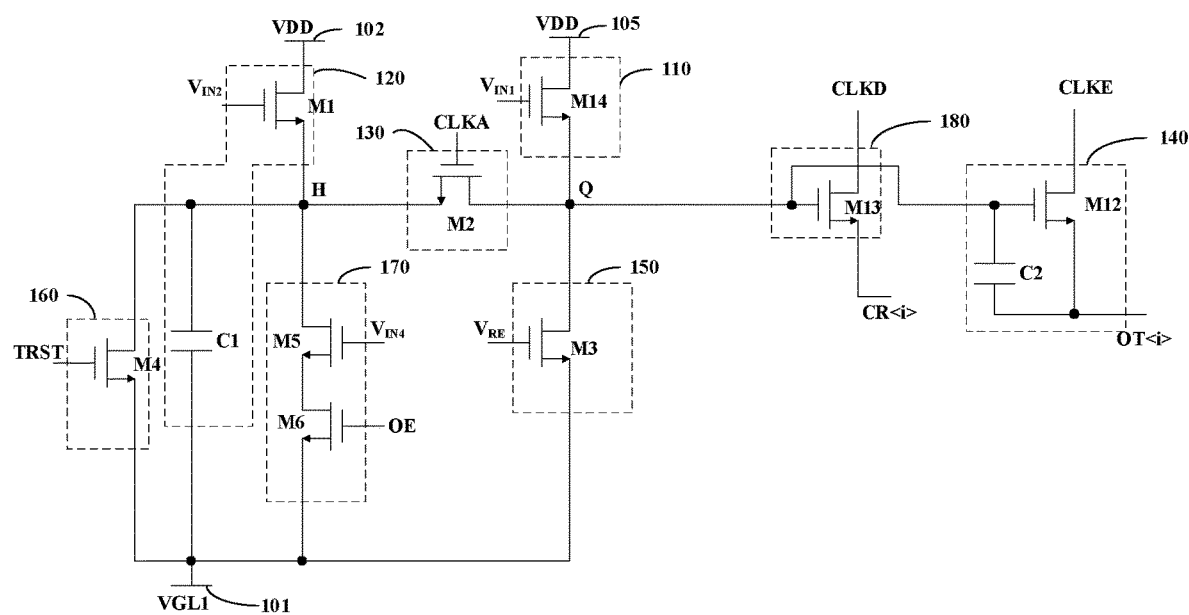
FIG. 3 is a circuit structure diagram illustrating a shift register unit according to another embodiment of the present disclosure.

FIG. 3 is a circuit structure diagram illustrating a shift register unit according to another embodiment of the present disclosure. As illustrated in FIG. 3, the shift register unit may include a first input sub-circuit 110, a second input sub-circuit 120, a first isolation sub-circuit 130, and a first output sub-circuit 140, which are basically identical with the first input sub-circuit 110, the second input sub-circuit 120, the first isolation sub-circuit 130, and the first output sub-circuit 140 illustrated in FIG. 2, and are not repeated here.

In some embodiments, as illustrated in FIG. 3, the shift register unit may further include a first reset sub-circuit 150. The first reset sub-circuit 150 may be configured to reset the potential of the first node Q under control of a first reset signal $V_{RE}$. For example, the first reset sub-circuit can reset the potential of the first node Q of the shift register unit in a current row.

For example, as illustrated in FIG. 3, the first reset sub-circuit 150 may include a third switching transistor M3. A first electrode of the third switching transistor M3 is electrically connected to the first node Q. A second electrode of the third switching transistor M3 is electrically connected to the first voltage terminal 101. For example, the first voltage terminal can provide the low level VGL1. A gate electrode of the third switching transistor M3 is configured to receive the first reset signal $V_{RE}$. For example, the third switching transistor M3 may be an NMOS transistor or a PMOS transistor.

In some embodiments, as illustrated in FIG. 3, the shift register unit may further include a second reset sub-circuit 160. The second reset sub-circuit 160 may be configured to reset the potential of the first node Q and the potential of the second node H under control of a second reset signal TRST. For example, the second reset sub-circuit can reset shift register units in all rows of a full screen at the same time.

For example, as illustrated in FIG. 3, the second reset sub-circuit 160 may include a fourth switching transistor M4. A first electrode of the fourth switching transistor M4 is electrically connected to the second node H. A second electrode of the fourth switching transistor M4 is electrically connected to the first voltage terminal 101, and for example, the first voltage terminal can provide the low level VGL1. A gate electrode of the fourth switching transistor M4 is configured to receive the second reset signal TRST. For example, the fourth switching transistor M4 may be an NMOS transistor or a PMOS transistor.

In some embodiments, as illustrated in FIG. 3, the shift register unit may further include a third reset sub-circuit 170. The third reset sub-circuit 170 may be configured to reset the potential of the second node H under control of a fourth input signal $V_{IN4}$ and a fifth input signal OE. For example, under control of the fourth input signal $V_{IN4}$ and the fifth input signal OE, the second node H in the shift register units in other rows except the current row may be reset, and the electrical coupling between the second node H and the first voltage terminal 101 of the shift register unit in the current row may be interrupted, so that the second node H of the shift register unit in the current row can be maintained at the second level.

In some embodiments, as illustrated in FIG. 3, the third reset sub-circuit 170 may include a fifth switching transistor M5 and a sixth switching transistor M6. A first electrode of the fifth switching transistor M5 is electrically connected to the second node H. A second electrode of the fifth switching transistor M5 is electrically connected to a first electrode of the sixth switching transistor M6. A gate electrode of the fifth switching transistor M5 is configured to receive the fourth input signal $V_{IN4}$. A second electrode of the sixth switching transistor M6 is electrically connected to the first voltage terminal 101. A gate electrode of the sixth switching transistor M6 is configured to receive the fifth input signal OE. For example, the fifth switching transistor M5 may be an NMOS transistor or a PMOS transistor, and the sixth switching transistor M6 may be an NMOS transistor or a PMOS transistor.

In some embodiments, as illustrated in FIG. 3, the shift register unit may further include a second output sub-circuit 180. The second output sub-circuit 180 may be configured to output a carry control signal CR<i> under control of a second clock signal CLKD in the display phase. The carry control signal CR<i> may be output to other shift register units. For example, the carry control signal CR<i> may serve as the first input signal $V_{IN1}$ and the second input signal $V_{IN2}$ of the shift register unit of a certain row (in this case, the first input signal $V_{IN1}$ and the second input signal $V_{IN2}$ are the same signal) or serve as the first reset signal $V_{RE}$ and the fourth input signal $V_{IN4}$ of the shift register unit of another row (in this case, the first reset signal $V_{RE}$ and the fourth input signal $V_{IN4}$ are the same signal).

In some embodiments, as illustrated in FIG. 3, the second output sub-circuit 180 may include a thirteenth switching transistor M13. A first electrode of the thirteenth switching transistor M13 is configured to receive the second clock signal CLKD. A second electrode of the thirteenth switching transistor M13 serves as an output terminal of the second output sub-circuit 180. A gate electrode of the thirteenth switching transistor M13 is electrically connected to the first node Q. For example, the thirteenth switching transistor M13 may be an NMOS transistor or a PMOS transistor.

In the above embodiments, by providing the second output sub-circuit in the shift register unit, the carry control between different shift register units can be implemented.

Figure 4:
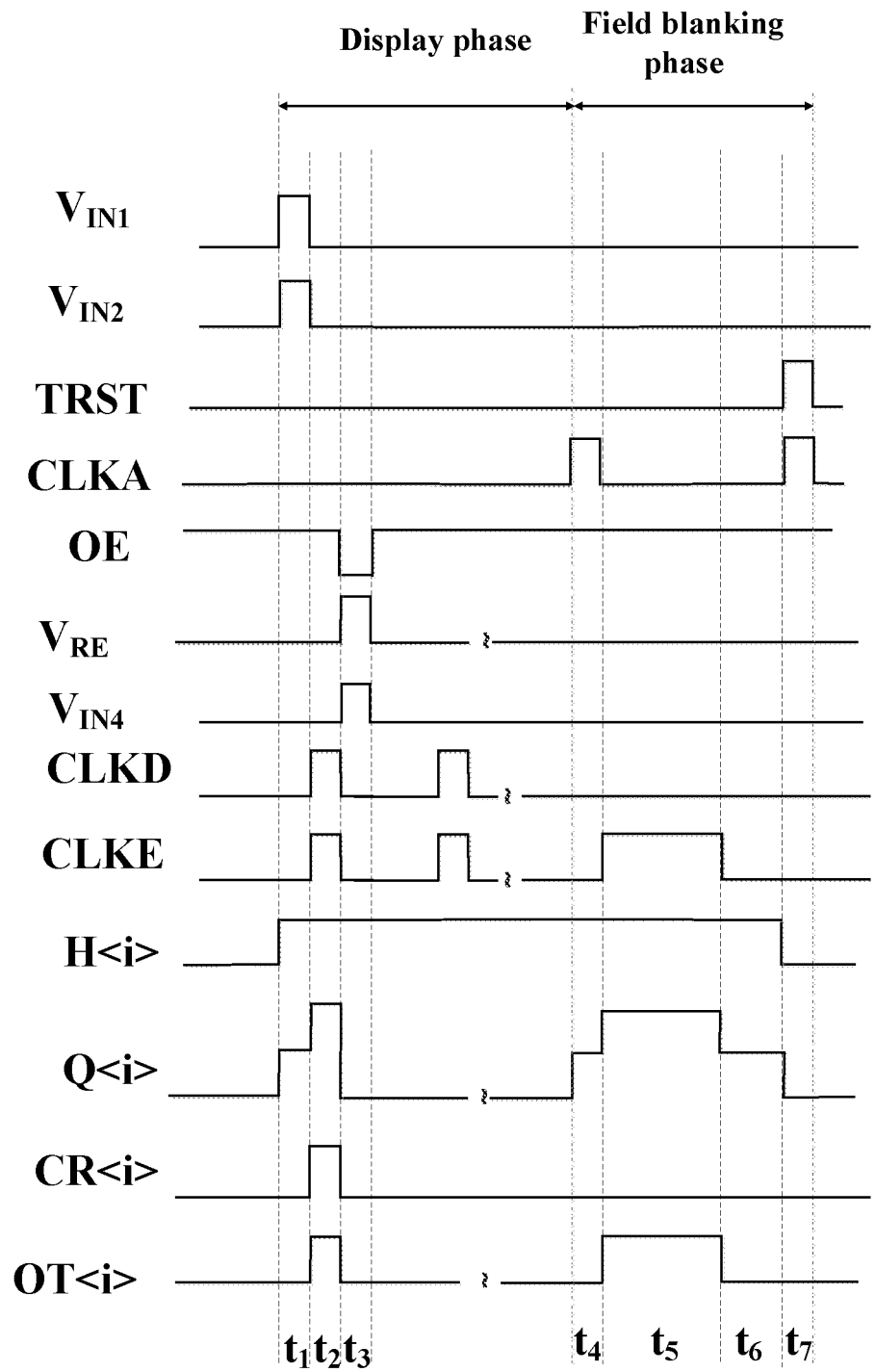
FIG. 4 is a timing diagram of control signals for a shift register unit according to at least one embodiment of the present disclosure.

FIG. 4 is a timing diagram illustrating control signals for a shift register unit according to at least one embodiment of the present disclosure. The operating process of the shift register unit according to some embodiments of the present disclosure is described in detail with reference to FIG. 3 and FIG. 4. Here, it is described by taking as examples that each switching transistor in the shift register unit is an NMOS transistor, the first level is a low level, and the second level is a high level. In the display process of one image frame, there are a display phase and a field blanking phase. As illustrated in FIG. 4, the display phase may include phases from a first phase (i.e., a $t_1$ phase) to a third phase (i.e., a $t_3$ phase), and the field blanking phase may include phases from a fourth phase (i.e., a $t_4$ phase) to a seventh phase (i.e., a $t_7$ phase).

As illustrated in FIG. 4, in the first phase (i.e., the $t_1$ phase), the first reset signal $V_{RE}$, the second reset signal TRST, the third input signal CLKA, the fourth input signal $V_{IN4}$, the first clock signal CLKE, and the second clock signal CLKD are all at a low level, the fifth input signal OE is at a high level, and the first input signal $V_{IN1}$ and the second input signal $V_{IN2}$ are at a high level. In this case, the fourteenth switching transistor M14 and the first switching transistor M1 are turned on. The potential of the first node Q changes from a low level (as the first level) to a high level (as the second level), and the potential of the second node H changes from a low level (as the first level) to a high level (as the second level). The first output sub-circuit 140 outputs a gate driving signal OT<i> which is at a low level, and the second output sub-circuit 180 outputs a carry control signal CR<i> which is at a low level.

Here, OT<i> indicates the gate driving signal output in the display phase or the compensation driving signal output in the field blanking phase by the $i^{th}$ shift register unit (as the current shift register unit), CR<i> indicates the carry control signal output by the $i^{th}$ shift register unit (as the current shift register unit), and i is a positive integer. In this example, the gate driving signal which is at a low level serves as an invalid gate driving signal, and the carry control signal which is at a low level serves as an invalid carry control signal.

Next, in the second phase (i.e., the $t_2$ phase), the first input signal $V_{IN1}$ and the second input signal $V_{IN2}$ change to a low level, the first reset signal $V_{RE}$, the second reset signal TRST, the third input signal CLKA, and the fourth input signal $V_{IN4}$ are at a low level, the fifth input signal OE is at a high level, and the first clock signal CLKE and the second clock signal CLKD change to a high level. In this case, due to the bootstrapping effect of the second capacitor C2, the potential of the first node Q is continuously pulled up to the third level. The first output sub-circuit 140 outputs the gate driving signal OT<i> which is at a high level, and the second output sub-circuit 180 outputs the carry control signal CR<i> which is at a high level. In this example, the gate driving signal which is at a high level serves as an effective gate driving signal, and the carry control signal which is at a high level serves as an effective carry control signal.

Next, as illustrated in FIG. 4, in the third phase (i.e., the $t_3$ phase), the first clock signal CLKE and the second clock signal CLKD change to a low level, and the first output sub-circuit 140 outputs the gate driving signal OT<i> which is at a low level, and the second output sub-circuit 180 outputs the carry control signal CR<i> which is at a low level. That is, both the output terminal of the first output sub-circuit 140 and the output terminal of the second output sub-circuit 180 are reset. The first reset signal $V_{RE}$ changes to a high level, so that the third switching transistor M3 is turned on. In this case, the potential of the first node Q is reset to the low level VGL1 (as the first level). The fourth input signal $V_{IN4}$ changes to a high level, so that the fifth switching transistor M5 is turned on. However, because the fifth input signal OE changes to a low level, the sixth switching transistor M6 is turned off. Therefore, the potential of the second node H is maintained at a high level (as the second level).

In the above process, the shift register unit achieves the purpose of outputting the gate driving signal in the display phase. In the above process, the high level (as the second level) of the second node H is kept until the field blanking phase.

Next, as illustrated in FIG. 4, in the fourth phase (i.e., the $t_4$ phase), the first input signal $V_{IN1}$, the second input signal $V_{IN2}$, the first reset signal $V_{RE}$, the second reset signal TRST, the fourth input signal $V_{IN4}$, the first clock signal CLKE, and the second clock signal CLKD are all at a low level, the fifth input signal OE is at a high level, and the third input signal CLKA changes to a high level. In this case, the second switching transistor M2 is turned on. Because the potential of the second node H is at a high level, the high level is also written into the first node Q, that is, the potential of the first node Q changes from a low level (as the first level) to a high level (as the second level).

Next, as illustrated in FIG. 4, in the fifth phase (i.e., the $t_5$ phase), the first input signal $V_{IN1}$, the second input signal $V_{IN2}$, the third input signal CLKA, the fourth input signal $V_{IN4}$, the first reset signal $V_{RE}$, the second reset signal TRST, and the second clock signal CLKD are all at a low level, the fifth input signal OE is at a high level, and the first clock signal CLKE changes to a high level. In this case, due to the bootstrapping effect of the second capacitor C2, the potential of the first node Q is continuously pulled up to the third level. In this case, the first output sub-circuit 140 outputs a high-level compensation driving signal OT<i>. In this example, the high-level compensation driving signal serves as an effective compensation driving signal.

Next, as illustrated in FIG. 4, in the sixth phase (i.e., the $t_6$ phase), the first clock signal CLKE changes to a low level. Accordingly, the potential of the first node Q is lowered from the third level to the second level. The first output sub-circuit 140 outputs a low-level compensation driving signal OT<i>. In this example, the low-level compensation driving signal serves as an invalid compensation driving signal.

Next, as illustrated in FIG. 4, in the seventh phase (i.e., the $t_7$ phase), both the second reset signal TRST and the third input signal CLKA change to a high level. In this case, both the fourth switching transistor M4 and the second switching transistor M2 are turned on, so that both the first node Q and the second node H are reset to be at the low level VGL1 (as the first level). For example, this operation may cause the potentials of the first nodes Q and the second nodes H of the shift register units in all rows to be reset. In this way, the process of outputting the compensation driving signal by the shift register unit is completed.

So far, the operating process of the shift register unit according to some embodiments of the present disclosure is described. In this operating process, the shift register unit outputs the gate driving signal in the display phase and outputs the compensation driving signal in the field blanking phase. The gate driving signal may be used to turn on a switching transistor of the corresponding sub-pixel circuit during the display process of the display device, and the compensation driving signal may be used to turn on the corresponding switching transistor of the corresponding sub-pixel circuit during the compensation process. Therefore, the shift register unit can implement the function of outputting different signals in different phases without affecting the normal display of the display device. The gate driving signal and the compensation driving signal may have different periods and different pulse widths, respectively.

In some embodiments, the third input signal CLKA, the first clock signal CLKE, the second clock signal CLKD, and the second reset signal TRST may be clock signals controlled by external circuits, respectively. In some embodiments, the pulse width relationships between all the signals described above are adjustable. In some embodiments, the fifth input signal OE may be a random signal generated by an external circuit (e.g., field programmable gate array (FPGA), etc.).

Figure 5:
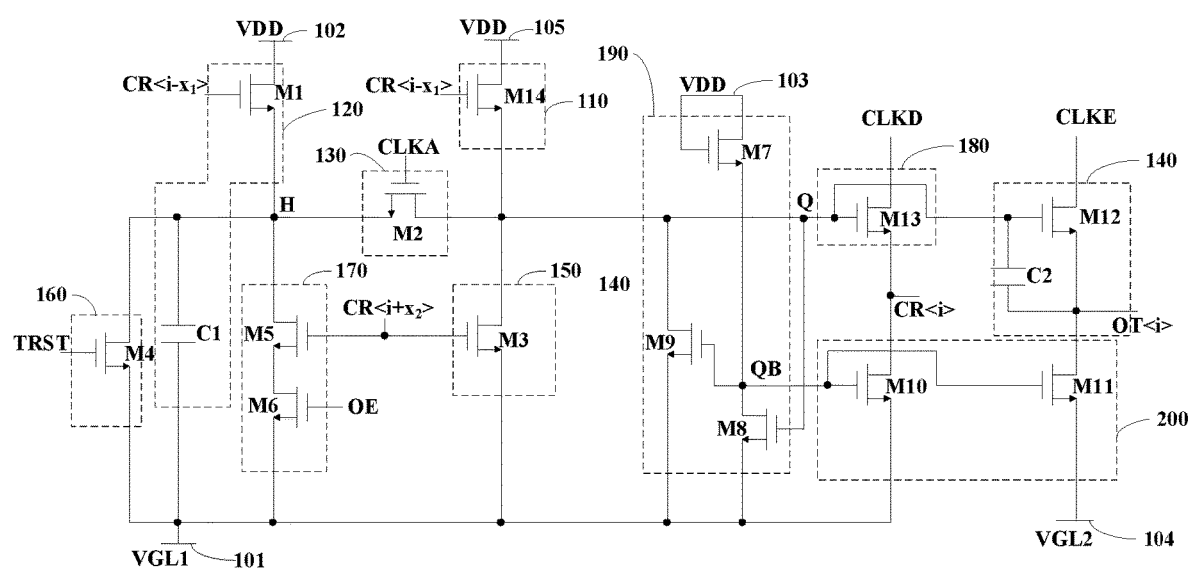
FIG. 5 is a circuit structure diagram illustrating a shift register unit according to another embodiment of the present disclosure.

FIG. 5 is a circuit structure diagram illustrating a shift register unit according to another embodiment of the present disclosure. As illustrated in FIG. 5, the shift register unit may include a first input sub-circuit 110, a second input sub-circuit 120, a first isolation sub-circuit 130, a first output sub-circuit 140, a first reset sub-circuit 150, a second reset sub-circuit 160, a third reset sub-circuit 170, and a second output sub-circuit 180. The illustration of these sub-circuits can be with reference to the foregoing, and is not repeated here.

In some embodiments, as illustrated in FIG. 5, the shift register unit may further include a noise reduction sub-circuit 190. The noise reduction sub-circuit 190 may be configured to maintain the potential of the first node Q at the first level in the case where the potential of the first node Q is reset. In this way, it can be further ensured that the first node Q is completely reset, which helps to reduce noise.

In some embodiments, as illustrated in FIG. 5, the noise reduction sub-circuit 190 may include a seventh switching transistor M7, an eighth switching transistor M8, and a ninth switching transistor M9. A first electrode of the seventh switching transistor M7 and a gate electrode of the seventh switching transistor M7 are both electrically connected to a third voltage terminal 103 for providing the second level. A second electrode of the seventh switching transistor M7 is electrically connected to a third node QB. For example, the seventh switching transistor M7 may be an NMOS transistor or a PMOS transistor. For example, the second level may be a high level (e.g., the power supply voltage VDD). A first electrode of the eighth switching transistor M8 is electrically connected to the third node QB. A second electrode of the eighth switching transistor M8 is electrically connected to the first voltage terminal 101. A gate electrode of the eighth switching transistor M8 is electrically connected to the first node Q. For example, the eighth switching transistor M8 may be an NMOS transistor or a PMOS transistor. A first electrode of the ninth switching transistor M9 is electrically connected to the first node Q. A second electrode of the ninth switching transistor M9 is electrically connected to the first voltage terminal 101. A gate electrode of the ninth switching transistor M9 is electrically connected to the third node QB. For example, the ninth switching transistor M9 may be an NMOS transistor or a PMOS transistor.

The following is described by taking as examples that the seventh switching transistor M7, the eighth switching transistor M8, and the ninth switching transistor M9 are NMOS transistors. In the operating process described above, the first node Q is reset in a certain phase or certain phases (for example, the $t_3$ phase or the $t_7$ phase). In the case where the first node Q is reset to be at a low level (i.e., the first level), the eighth switching transistor M8 is turned off. The third voltage terminal 103 outputs a high-level power supply voltage VDD, so that the seventh switching transistor M7 is turned on, thereby allowing the potential of the third node QB to be at a high level. In this case, the ninth switching transistor M9 is turned on. Therefore, the first node Q can be sufficiently pulled down to the potential VGL1 of the first voltage terminal 101, so that the potential of the first node Q is maintained at the first level. In this way, the first node Q can be completely reset, which helps to reduce noise.

In some embodiments, as illustrated in FIG. 5, the shift register unit may further include a potential maintaining sub-circuit 200. The potential maintaining sub-circuit 200 may be configured to maintain a potential of an output terminal of the first output sub-circuit 140 at a fourth level and maintain a potential of an output terminal of the second output sub-circuit 180 at the first level in the case where the potential of the first node Q is reset. For example, the second level is between the fourth level and the third level. In this way, the fourth level and the first level belong to the same type of level. That is, in the case where the first level is a low level, the fourth level is also a low level, and in the case where the first level is a high level, the fourth level is also a high level. In some embodiments, the fourth level may be equal to the first level. In some other embodiments, the fourth level may not be equal to the first level. For example, the fourth level is higher than the first level.

In some embodiments, the potential maintaining sub-circuit 200 may include a tenth switching transistor M10 and an eleventh switching transistor M11. A first electrode of the tenth switching transistor M10 is electrically connected to the output terminal of the second output sub-circuit 180 (for example, the second electrode of the thirteenth switching transistor M13). A second electrode of the tenth switching transistor M10 is electrically connected to the first voltage terminal 101. A gate electrode of the tenth switching transistor M10 is electrically connected to the third node QB. For example, the tenth switching transistor M10 may be an NMOS transistor or a PMOS transistor. A first electrode of the eleventh switching transistor M11 is electrically connected to the output terminal of the first output sub-circuit 140 (for example, the second electrode of the twelfth switching transistor M12). A second electrode of the eleventh switching transistor M11 is electrically connected to a fourth voltage terminal 104 for providing the fourth level. A gate electrode of the eleventh switching transistor M11 is electrically connected to the third node QB. For example, the eleventh switching transistor M11 may be an NMOS transistor or a PMOS transistor. For example, the fourth level may be a low level VGL2 (e.g., a negative level).

The following is described by taking as examples that the tenth switching transistor M10 and the eleventh switching transistor M11 are NMOS transistors. In the case where the first node Q is at a high level, the eighth switching transistor M8 is turned on and the third node QB is at a low level, so that the tenth switching transistor M10 and the eleventh switching transistor M11 are turned off, which does not affect the outputting of signals by the first output sub-circuit 140 and the second output sub-circuit 180. In the case where the first node Q is reset to be at a low level, the eighth switching transistor M8 is turned off. Because the seventh switching transistor M7 is turned on, the third node QB is at a high level, so that the tenth switching transistor M10 and the eleventh switching transistor M11 are turned on. In this way, the output terminal of the second output sub-circuit 180 can be pulled down to the low level VGL1 (i.e., the first level) of the first voltage terminal 101 and the output terminal of the first output sub-circuit 140 can be pulled down to the low level VGL2 (i.e., the fourth level) of the fourth voltage terminal 104. In this way, the potentials of the output terminal of the first output sub-circuit and the output terminal of the second output sub-circuit can be maintained at a low level, thus reducing noise.

So far, the shift register unit according to some other embodiments of the present disclosure is described. It can be seen from FIG. 5 that the circuit structure of the shift register unit is simplified.

In some embodiments of the present disclosure, a gate driving circuit is also provided. The gate driving circuit may include a plurality of shift register units as described above (for example, the shift register units illustrated in FIG. 1, FIG. 2, FIG. 3 or FIG. 5).

In some embodiments, the plurality of shift register units may include N shift register units, and N is a positive integer. Among the N shift register units, a carry control signal output by the $(i-x1)^{th}$ shift register unit serves as a first input signal $V_{IN1}$ and a second input signal $V_{IN2}$ of the $i^{th}$ shift register unit (as illustrated in FIG. 5). The first input signals for the first to $x1^{th}$ shift register units are respectively the first input signals output by an external circuit, and the second input signals for the first to $x1^{th}$ shift register units are respectively the second input signals output by the external circuit, $x1+1 \leq i \leq N$, i is a positive integer, and x1 is a positive integer.

In this embodiment, the first input signal and the second input signal for each shift register unit are the same signal. Therefore, the carry control signal output by the $(i-x1)^{th}$ shift register unit serves as the first input signal and the second input signal of the $i^{th}$ shift register unit, and the first input signals and the second input signals for the first to $x1^{th}$ shift register units are signals output by an external circuit, respectively.

In some embodiments, among the N shift register units, a carry control signal output by the $(j+x2)^{th}$ shift register unit serves as a first reset signal $V_{RE}$ and a fourth input signal $V_{IN4}$ of the $j^{th}$ shift register unit (as illustrated in FIG. 5, here j takes i as an example). The first reset signals for the $(N-x2+1)^{th}$ to the $N^{th}$ shift register units are respectively the first reset signals output by the external circuit. The fourth input signals for the $(N-x2+1)^{th}$ to the $N^{th}$ shift register units are respectively the fourth input signals output by the external circuit. $1 \leq j \leq N-x2$, j is a positive integer, and x2 is a positive integer.

In this embodiment, the first reset signal and the fourth input signal for each shift register unit are the same signal. Therefore, a carry control signal output by the $(j+x2)^{th}$ shift register unit serves as the first reset signal and the fourth input signal of the $j^{th}$ shift register unit. The first reset signals and the fourth input signals for the $(N-x2+1)^{th}$ to the $N^{th}$ shift register units are signals output by an external circuit, respectively.

It should be noted that the external circuit mentioned above may be a known integrated circuit, etc. The external circuit may be used to output a first input signal, a second input signal, a first reset signal, and a fourth input signal. For example, the external circuit may output different signals in different phases or in a same phase.

Figure 6:
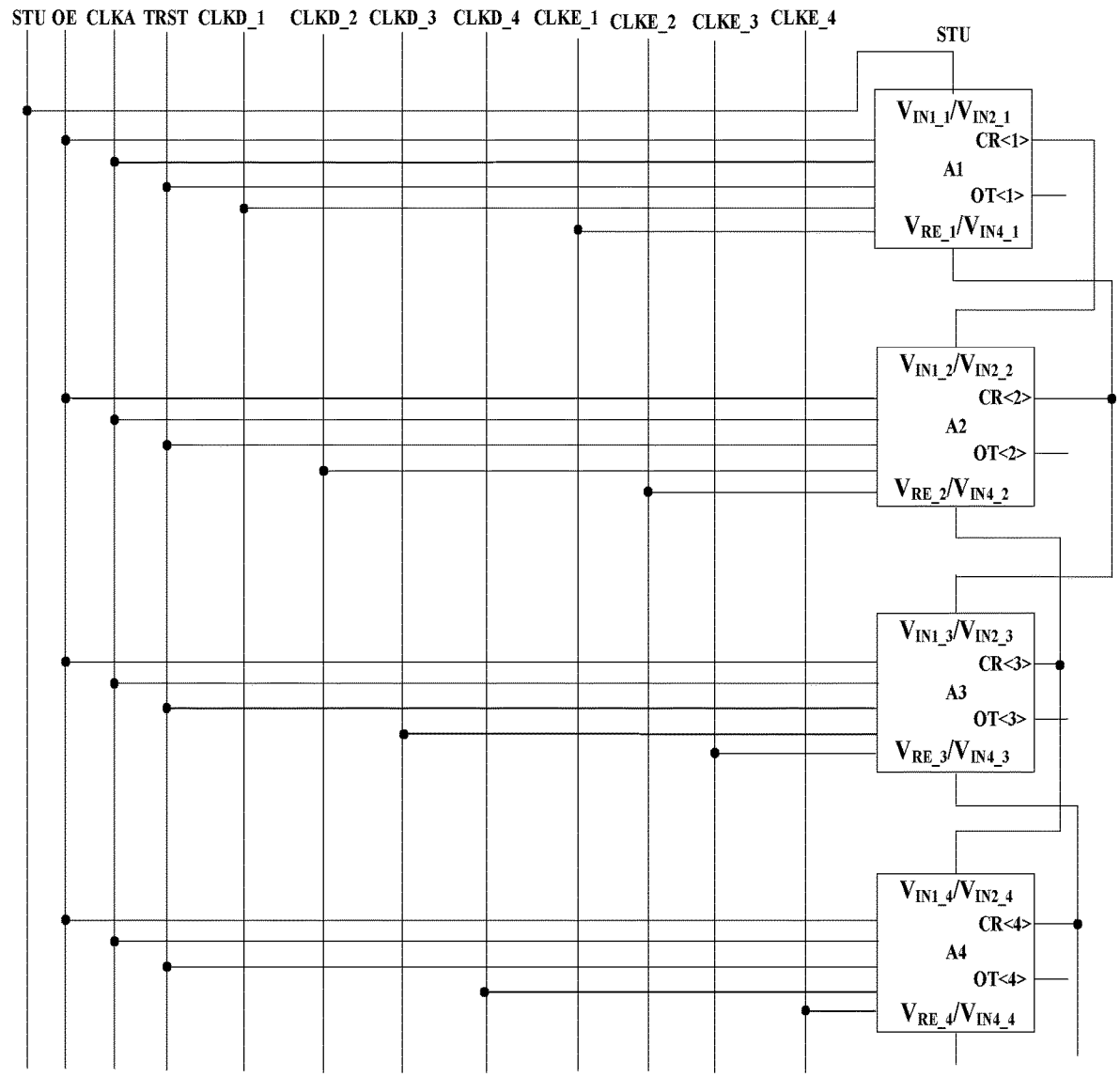
FIG. 6 is a structural diagram illustrating a gate driving circuit according to at least one embodiment of the present disclosure.

FIG. 6 is a structural diagram illustrating a gate driving circuit according to at least one embodiment of the present disclosure. FIG. 6 illustrates the case where four shift register units (A1 to A4) form one group of units. FIG. 6 illustrates a start signal STU, a fifth input signal OE, a third input signal CLKA, a second reset signal TRST, four first clock signals CLKE_1 to CLKE_4, and four second clock signals CLKD_1 to CLKD_4. Here, in the gate driving circuit, every four first clock signals repeatedly appear, and every four second clock signals repeatedly appear.

Taking x1=1 and x2=1 as examples, the gate driving circuit according to some embodiments of the present disclosure is described in detail with reference to FIG. 5 and FIG. 6.

In some embodiments, a carry control signal CR<i-1> output by the $(i-1)^{th}$ shift register unit serves as a first input signal $V_{IN1}$ and a second input signal $V_{IN2}$ of the $i^{th}$ shift register unit. For example, as illustrated in FIG. 6, a carry control signal CR<1> output by the first shift register unit A1 serves as a first input signal $V_{IN1\_2}$ and a second input signal $V_{IN2\_2}$ of the second shift register unit A2, and a carry control signal CR<2> output by the second shift register unit A2 serves as a first input signal $V_{IN1\_3}$ and a second input signal $V_{IN2\_3}$ of the third shift register unit A3, and so on. In addition, the first input signal $V_{IN1\_1}$ and the second input signal $V_{IN2\_1}$ of the first shift register unit A1 are the start signal STU output by an external circuit (not illustrated in FIG. 6).

In some embodiments, a carry control signal CR<j+1> output by the $(j+1)^{th}$ shift register unit serves as a first reset signal $V_{RE}$ and a fourth input signal $V_{IN4}$ of the $j^{th}$ shift register unit. For example, as illustrated in FIG. 6, a carry control signal CR<4> output by the fourth shift register unit A4 serves as a first reset signal $V_{RE\_3}$ and a fourth input signal $V_{IN4\_3}$ of the third shift register unit A3, and a carry control signal CR<3> output by the third shift register unit A3 serves as a first reset signal $V_{RE\_2}$ and a fourth input signal $V_{IN4\_2}$ of the second shift register unit A2. In addition, a first reset signal and a fourth input signal of the $N^{th}$ shift register unit are signals output by an external circuit (not illustrated in FIG. 6).

So far, the gate driving circuit according to some embodiments of the present disclosure is described in detail. By controlling the operation of each shift register unit in the gate driving circuit, the gate driving circuit can output a gate driving signal in the display phase and output a compensation driving signal in the field blanking phase. In the above gate driving circuit, by outputting the compensation driving signal, for example, the driving thin film transistors in any row of sub-pixels can be compensated in any frame.

It should be noted that although FIG. 6 illustrates the case where four shift register units are one group of units, the scope of the embodiments of the present disclosure is not limited to this. For example, other numbers (e.g., more than 4) of shift register units may be one group of units.

Figure 7:
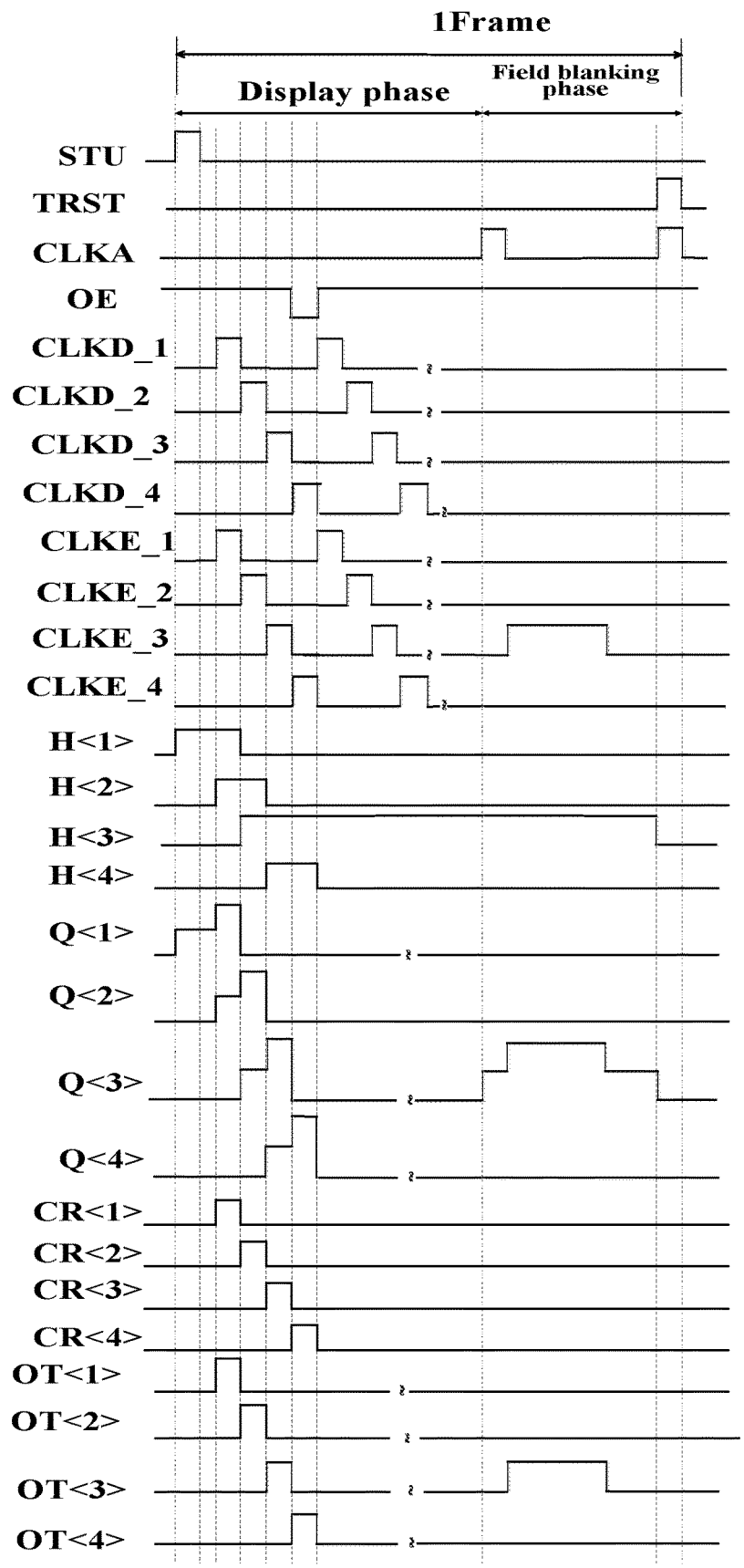
FIG. 7 is a timing diagram of control signals for a gate driving circuit according to at least one embodiment of the present disclosure.

FIG. 7 is a timing diagram illustrating control signals for a gate driving circuit according to at least one embodiment of the present disclosure. FIG. 7 exemplarily illustrates the operating process in which the third shift register unit A3 in the gate driving circuit illustrated in FIG. 6 outputs a gate driving signal in the display phase and outputs a compensation driving signal in the field blanking phase.

During the operating process, the carry control signal CR<2> output by the second shift register unit serves as the first input signal $V_{IN1\_3}$ and the second input signal $V_{IN2\_3}$ of the third shift register unit, and the carry control signal CR<4> output by the fourth shift register unit serves as the first reset signal $V_{RE\_3}$ and the fourth input signal $V_{IN4\_3}$ of the third shift register unit. In addition, as can be seen from FIG. 7, in the four shift register units, the high level (as the second level) of the second node H<3> of the third shift register unit (as the shift register unit of the current row) maintains until the field blanking phase, and the high level of the second nodes (for example, H<1>, H<2>, and H<4>) of the other shift register units cannot maintain until the field blanking phase. With regard to the operating process of the third shift register unit A3, reference can be made to the operating process of the shift register unit described above in conjunction with FIG. 4, which is not repeated here.

In some embodiments of the present disclosure, a display device is also provided. The display device may include the gate driving circuit described above (for example, the gate driving circuit illustrated in FIG. 6). For example, the display device may be any product or component having the display function, such as a display panel, a mobile phone, a tablet computer, a television, a monitor, a notebook computer, a digital photo frame, a navigator, etc.

Figure 8:
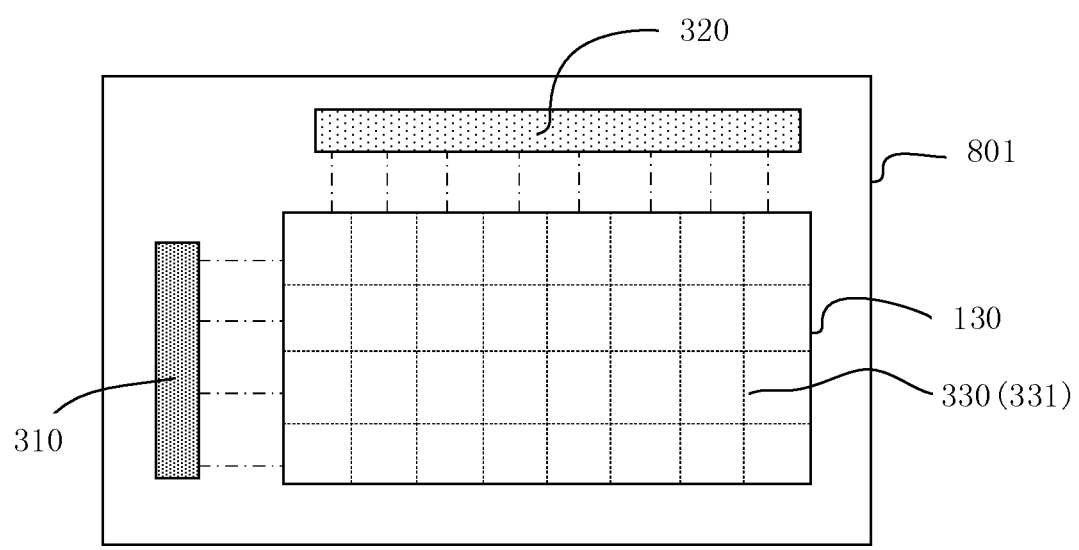
FIG. 8 is a schematic block diagram illustrating a display panel according to at least one embodiment of the present disclosure.

FIG. 8 is a schematic block diagram of a display panel provided by some embodiments of the present disclosure. For example, as illustrated in FIG. 8, the display panel includes an array substrate 801 which includes a gate driving circuit 310, a data driving circuit 320, and a plurality of pixel units 330 arranged in an array, and the pixel units 330 include cathodes 331. For example, in some examples, the cathodes 331 of the plurality of pixel units 330 are integrally formed to form a common cathode structure. For example, a first power supply voltage is supplied to the cathodes 331. For example, in an embodiment of the present disclosure, the gate driving circuit 310 is configured to output gate driving signals to the plurality of pixel units 330 in a display phase and output compensation driving signals to the plurality of pixel units 330 in a field blanking phase. For example, the data driving circuit 320 is configured to provide data signals to the plurality of pixel units 330.

It should be noted that the above display panel may also include other components, such as a timing controller, a signal decoding circuit, a voltage conversion circuit, etc. These components may adopt existing conventional components, which are not repeated here. The technical effects of the above display panel may be referred to the corresponding descriptions of the shift register units and the gate driving circuits in the above embodiments, which are not repeated here.

Figure 9:
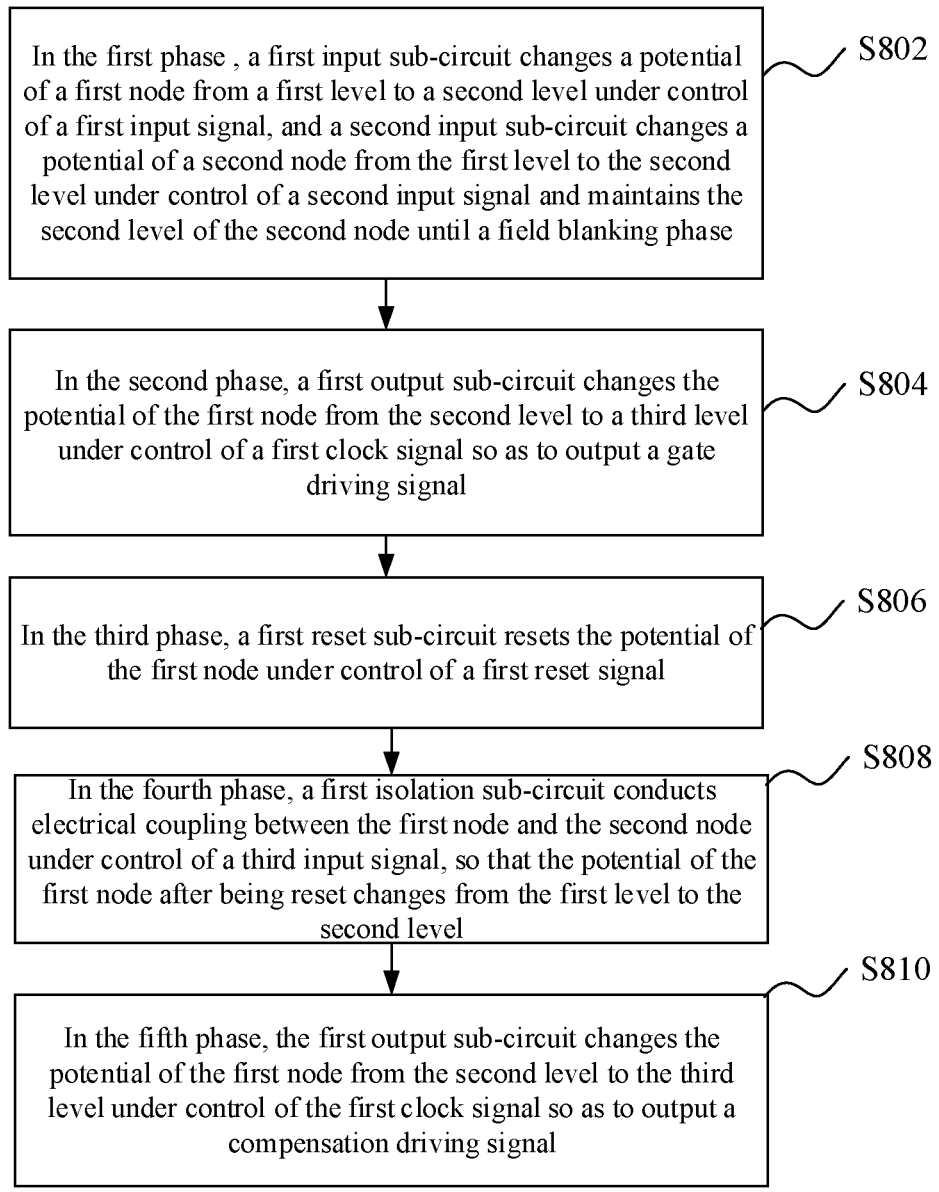
FIG. 9 is a flowchart illustrating a method for controlling a shift register unit according to at least one embodiment of the present disclosure.

FIG. 9 is a flowchart illustrating a method for controlling a shift register unit according to at least one embodiment of the present disclosure. As illustrated in FIG. 9, the method may include steps S802 to S810.

In step S802, in a first phase (such as the $t_1$ phase described above), a first input sub-circuit changes a potential of a first node from a first level to a second level under control of a first input signal, and a second input sub-circuit changes a potential of a second node from the first level to the second level under control of a second input signal and maintains the second level of the second node until a field blanking phase.

In step S804, in a second phase (such as the $t_2$ phase described above), a first output sub-circuit changes the potential of the first node from the second level to a third level under control of a first clock signal so as to output a gate driving signal. The second level is between the first level and the third level.

In step S806, in a third phase (for example, the $t_3$ phase described above), a first reset sub-circuit resets the potential of the first node under control of a first reset signal.

In step S808, in a fourth phase (for example, the $t_4$ phase described above), a first isolation sub-circuit conducts electrical coupling between the first node and the second node under control of a third input signal, so that the potential of the first node after being reset changes from the first level to the second level.

In step S810, in a fifth phase (for example, the $t_5$ phase described above), the first output sub-circuit changes the potential of the first node from the second level to the third level under control of the first clock signal so as to output a compensation driving signal.

For example, the first phase, the second phase, and the third phase are all within a display phase, and the fourth phase and the fifth phase are all within a field blanking phase. It should be noted that in the embodiments of the present disclosure, the display phase may include more phases for other operations and signal processing, and the field blanking phase may also include more phases for other operations and signal processing, which is not limited in the embodiments of the present disclosure.

So far, the method for controlling the shift register unit according to some embodiments of the present disclosure is provided. By using the method described above, the shift register unit can output a gate driving signal in a display phase and output a compensation driving signal in a field blanking phase. Therefore, the method can allow the shift register unit to implement the function of outputting different signals in different phases without affecting the normal display of the display device.

In some embodiments, the method may further include: after the first output sub-circuit outputs the compensation driving signal, a second reset sub-circuit resetting the potential of the first node and the potential of the second node under control of a second reset signal.

So far, various embodiments of the present disclosure are described in detail. In order to avoid obscuring the concepts of the present disclosure, some details that are well known in the art are not described. According to the above description, those skilled in the art can fully understand how to implement the technical schemes disclosed herein.

For the present disclosure, the following statements should be noted.

(1) The accompanying drawings involve only the structure(s) in connection with the embodiment(s) of the present disclosure, and for other structure(s), reference can be made to common design(s).

(2) The embodiments of the present disclosure and features in the embodiments may be combined with each other to obtain new embodiments if they do not conflict with each other.

Although some specific embodiments of the present disclosure are described in detail by examples, it should be understood by those skilled in the art that the above examples are for illustration only, and not for limiting the scope of the present disclosure. Those skilled in the art should understand that the above embodiments can be modified or some technical features can be equivalently replaced without departing from the scope and spirit of the present disclosure. The scope of the present disclosure is defined by the accompanying claims.

What is claimed is:

1. A shift register unit, comprising:
    a first input sub-circuit, configured to control a potential of a first node;
    a second input sub-circuit, configured to control a potential of a second node;
    a first isolation sub-circuit between the first node and the second node, configured to control conduction and interruption of electrical coupling between the first node and the second node; and
    a first output sub-circuit, electrically connected to the first node, and configured to output a gate driving signal in a display phase and output a compensation driving signal in a field blanking phase after the display phase.

2. The shift register unit according to claim 1, wherein the first input sub-circuit is configured to change the potential of the first node from a first level to a second level under control of a first input signal in the display phase;
    the second input sub-circuit is between a first voltage terminal and a second voltage terminal, the first voltage terminal is used for providing the first level, the second voltage terminal is used for providing the second level, and the second input sub-circuit is configured to change the potential of the second node from the first level to the second level under control of a second input signal in the display phase and maintain the potential of the second node at the second level until the field blanking phase;
    the first isolation sub-circuit is configured to conduct the electrical coupling between the first node and the second node under control of a third input signal in the field blanking phase, so that the potential of the first node after being reset changes from the first level to the second level; and
    the first output sub-circuit is configured to, in the display phase, change the potential of the first node from the second level to a third level under control of a first clock signal so as to output the gate driving signal, and configured to, in the field blanking phase, change the potential of the first node from the second level to the third level under the control of the first clock signal so as to output the compensation driving signal; and
    the second level is between the first level and the third level.

3. The shift register unit according to claim 2, wherein the second input sub-circuit comprises a first capacitor and a first switching transistor;
  a first terminal of the first capacitor is electrically connected to the second node, and a second terminal of the first capacitor is electrically connected to the first voltage terminal; and
  a first electrode of the first switching transistor is electrically connected to the second voltage terminal, a second electrode of the first switching transistor is electrically connected to the second node, and a gate electrode of the first switching transistor is configured to receive the second input signal.

4. The shift register unit according to claim 2, wherein the first isolation sub-circuit comprises a second switching transistor; and
  a first electrode of the second switching transistor is electrically connected to the first node, a second electrode of the second switching transistor is electrically connected to the second node, and a gate electrode of the second switching transistor is configured to receive the third input signal.

5. The shift register unit according to claim 2, further comprising:
  a first reset sub-circuit, configured to reset the potential of the first node under control of a first reset signal;
  a second reset sub-circuit, configured to reset the potential of the first node and the potential of the second node under control of a second reset signal; and
  a third reset sub-circuit, configured to reset the potential of the second node under control of a fourth input signal and a fifth input signal.

6. The shift register unit according to claim 5, wherein the first reset sub-circuit comprises a third switching transistor,
  a first electrode of the third switching transistor is electrically connected to the first node, a second electrode of the third switching transistor is electrically connected to the first voltage terminal, and a gate electrode of the third switching transistor is configured to receive the first reset signal.

7. The shift register unit according to claim 5, wherein the second reset sub-circuit comprises a fourth switching transistor,
  a first electrode of the fourth switching transistor is electrically connected to the second node, a second electrode of the fourth switching transistor is electrically connected to the first voltage terminal, and a gate electrode of the fourth switching transistor is configured to receive the second reset signal.

8. The shift register unit according to claim 5, wherein the third reset sub-circuit comprises a fifth switching transistor and a sixth switching transistor;
  a first electrode of the fifth switching transistor is electrically connected to the second node, a second electrode of the fifth switching transistor is electrically connected to a first electrode of the sixth switching transistor, and a gate electrode of the fifth switching transistor is configured to receive the fourth input signal; and
  a second electrode of the sixth switching transistor is electrically connected to the first voltage terminal, and a gate electrode of the sixth switching transistor is configured to receive the fifth input signal.

9. The shift register unit according to claim 2, further comprising:
  a second output sub-circuit, electrically connected to the first node, and configured to output a carry control signal under control of a second clock signal in the display phase.

10. The shift register unit according to claim 9, further comprising:
  a noise reduction sub-circuit, configured to maintain the potential of the first node at the first level in a case where the potential of the first node is reset; and
  a potential maintaining sub-circuit, configured to maintain a potential of an output terminal of the first output sub-circuit at a fourth level and maintain a potential of an output terminal of the second output sub-circuit at the first level in a case where the potential of the first node is reset, wherein the second level is between the fourth level and the third level.

11. The shift register unit according to claim 10, wherein the noise reduction sub-circuit comprises a seventh switching transistor, an eighth switching transistor, and a ninth switching transistor;
  a first electrode of the seventh switching transistor and a gate electrode of the seventh switching transistor are both electrically connected to a third voltage terminal for providing the second level, and a second electrode of the seventh switching transistor is electrically connected to a third node;
  a first electrode of the eighth switching transistor is electrically connected to the third node, a second electrode of the eighth switching transistor is electrically connected to the first voltage terminal, and a gate electrode of the eighth switching transistor is electrically connected to the first node; and
  a first electrode of the ninth switching transistor is electrically connected to the first node, a second electrode of the ninth switching transistor is electrically connected to the first voltage terminal, and a gate electrode of the ninth switching transistor is electrically connected to the third node.

12. The shift register unit according to claim 10, wherein the potential maintaining sub-circuit comprises a tenth switching transistor and an eleventh switching transistor;
  a first electrode of the tenth switching transistor is electrically connected to the output terminal of the second output sub-circuit, a second electrode of the tenth switching transistor is electrically connected to the first voltage terminal, and a gate electrode of the tenth switching transistor is electrically connected to the third node; and
  a first electrode of the eleventh switching transistor is electrically connected to the output terminal of the first output sub-circuit, a second electrode of the eleventh switching transistor is electrically connected to a fourth voltage terminal for providing the fourth level, and a gate electrode of the eleventh switching transistor is electrically connected to the third node.

13. The shift register unit according to claim 9, wherein the second output sub-circuit comprises a thirteenth switching transistor; and
  a first electrode of the thirteenth switching transistor is configured to receive the second clock signal, a second electrode of the thirteenth switching transistor serves as an output terminal of the second output sub-circuit, and a gate electrode of the thirteenth switching transistor is electrically connected to the first node.

14. A gate driving circuit, comprising a plurality of shift register units according to claim 9.

15. The gate driving circuit according to claim 14, wherein the plurality of shift register units comprise N shift register units, and N is a positive integer;
among the N shift register units, a carry control signal output by an $(i-x1)^{th}$ shift register unit serves as a first input signal and a second input signal of an $i^{th}$ shift register unit, first input signals for first to $x1^{th}$ shift register units are respectively first input signals output by an external circuit, and second input signals for the first to $x1^{th}$ shift register units are respectively second input signals output by the external circuit, $x1+1 \le i \le N$, i is a positive integer, and x1 is a positive integer; and
among the N shift register units, a carry control signal output by a $(j+x2)^{th}$ shift register unit serves as a first reset signal and a fourth input signal of a $j^{th}$ shift register unit, first reset signals for $(N-x2+1)^{th}$ to $N^{th}$ shift register units are respectively first reset signals output by the external circuit, fourth input signals for the $(N-x2+1)^{th}$ to $N^{th}$ shift register units are respectively fourth input signals output by the external circuit, $1 \le j \le N-x2$, j is a positive integer, and x2 is a positive integer.

16. A display device, comprising the gate driving circuit according to claim 14.

17. The shift register unit according to claim 2, wherein the first output sub-circuit comprises a twelfth switching transistor and a second capacitor;
a first electrode of the twelfth switching transistor is configured to receive the first clock signal, a second electrode of the twelfth switching transistor serves as an output terminal of the first output sub-circuit, and a gate electrode of the twelfth switching transistor is electrically connected to the first node; and
a first terminal of the second capacitor is electrically connected to the gate electrode of the twelfth switching transistor, and a second terminal of the second capacitor is electrically connected to the second electrode of the twelfth switching transistor.

18. The shift register unit according to claim 2, wherein the first input sub-circuit comprises a fourteenth switching transistor; and
a first electrode of the fourteenth switching transistor is electrically connected to a fifth voltage terminal for providing the second level, a second electrode of the fourteenth switching transistor is electrically connected to the first node, and a gate electrode of the fourteenth switching transistor is configured to receive the first input signal.

19. The shift register unit according to claim 2, further comprising:
a first reset sub-circuit, a second reset sub-circuit, a third reset sub-circuit, a second output sub-circuit, a noise reduction sub-circuit, and a potential maintaining sub-circuit,
wherein the second input sub-circuit comprises a first capacitor and a first switching transistor, a first terminal of the first capacitor is electrically connected to the second node, a second terminal of the first capacitor is electrically connected to the first voltage terminal, a first electrode of the first switching transistor is electrically connected to the second voltage terminal, a second electrode of the first switching transistor is electrically connected to the second node, and a gate electrode of the first switching transistor is configured to receive the second input signal;
the first isolation sub-circuit comprises a second switching transistor, a first electrode of the second switching transistor is electrically connected to the first node, a second electrode of the second switching transistor is electrically connected to the second node, and a gate electrode of the second switching transistor is configured to receive the third input signal;
the first reset sub-circuit comprises a third switching transistor, a first electrode of the third switching transistor is electrically connected to the first node, a second electrode of the third switching transistor is electrically connected to the first voltage terminal, and a gate electrode of the third switching transistor is configured to receive a first reset signal;
the second reset sub-circuit comprises a fourth switching transistor, a first electrode of the fourth switching transistor is electrically connected to the second node, a second electrode of the fourth switching transistor is electrically connected to the first voltage terminal, and a gate electrode of the fourth switching transistor is configured to receive a second reset signal;
the third reset sub-circuit comprises a fifth switching transistor and a sixth switching transistor, a first electrode of the fifth switching transistor is electrically connected to the second node, a second electrode of the fifth switching transistor is electrically connected to a first electrode of the sixth switching transistor, a gate electrode of the fifth switching transistor is configured to receive a fourth input signal, a second electrode of the sixth switching transistor is electrically connected to the first voltage terminal, and a gate electrode of the sixth switching transistor is configured to receive a fifth input signal;
the noise reduction sub-circuit comprises a seventh switching transistor, an eighth switching transistor, and a ninth switching transistor, a first electrode of the seventh switching transistor and a gate electrode of the seventh switching transistor are both electrically connected to a third voltage terminal for providing the second level, a second electrode of the seventh switching transistor is electrically connected to a third node, a first electrode of the eighth switching transistor is electrically connected to the third node, a second electrode of the eighth switching transistor is electrically connected to the first voltage terminal, a gate electrode of the eighth switching transistor is electrically connected to the first node, a first electrode of the ninth switching transistor is electrically connected to the first node, a second electrode of the ninth switching transistor is electrically connected to the first voltage terminal, and a gate electrode of the ninth switching transistor is electrically connected to the third node;
the potential maintaining sub-circuit comprises a tenth switching transistor and an eleventh switching transistor, a first electrode of the tenth switching transistor is electrically connected to an output terminal of the second output sub-circuit, a second electrode of the tenth switching transistor is electrically connected to the first voltage terminal, and a gate electrode of the tenth switching transistor is electrically connected to the third node, a first electrode of the eleventh switching transistor is electrically connected to an output terminal of the first output sub-circuit, a second electrode of the eleventh switching transistor is electrically connected to a fourth voltage terminal for providing a fourth level, and a gate electrode of the eleventh switching transistor is electrically connected to the third node;

the first output sub-circuit comprises a twelfth switching transistor and a second capacitor, a first electrode of the twelfth switching transistor is configured to receive the first clock signal, a second electrode of the twelfth switching transistor serves as the output terminal of the first output sub-circuit, a gate electrode of the twelfth switching transistor is electrically connected to the first node, a first terminal of the second capacitor is electrically connected to the gate electrode of the twelfth switching transistor, and a second terminal of the second capacitor is electrically connected to the second electrode of the twelfth switching transistor;

the second output sub-circuit comprises a thirteenth switching transistor, a first electrode of the thirteenth switching transistor is configured to receive a second clock signal, a second electrode of the thirteenth switching transistor serves as the output terminal of the second output sub-circuit, and a gate electrode of the thirteenth switching transistor is electrically connected to the first node; and the first input sub-circuit comprises a fourteenth switching transistor, a first electrode of the fourteenth switching transistor is electrically connected to a fifth voltage terminal for providing the second level, a second electrode of the fourteenth switching transistor is electrically connected to the first node, and a gate electrode of the fourteenth switching transistor is configured to receive the first input signal.

20. A method for controlling a shift register unit, comprising:

in a first phase, changing, by a first input sub-circuit, a potential of a first node from a first level to a second level under control of a first input signal, and changing, by a second input sub-circuit, a potential of a second node from the first level to the second level under control of a second input signal, and maintaining the second level of the second node until a field blanking phase;

in a second phase, changing, by a first output sub-circuit, the potential of the first node from the second level to a third level under control of a first clock signal so as to output a gate driving signal, wherein the second level is between the first level and the third level;

in a third phase, resetting, by a first reset sub-circuit, the potential of the first node under control of a first reset signal;

in a fourth phase, conducting, by a first isolation sub-circuit, electrical coupling between the first node and the second node under control of a third input signal, so that the potential of the first node after being reset changes from the first level to the second level; and in a fifth phase, changing, by the first output sub-circuit, the potential of the first node from the second level to the third level under control of the first clock signal so as to output a compensation driving signal, wherein the first phase, the second phase, and the third phase are all within a display phase, and the fourth phase and the fifth phase are all within the field blanking phase.

* * * * *